(12) United States Patent
Kwon et al.

(10) Patent No.: US 11,230,194 B2
(45) Date of Patent: Jan. 25, 2022

(54) AUTOMATIC RECLOSING DEVICE AND METHOD FOR ELECTRICAL VEHICLE CHARGING CABLE CONTROL DEVICE

(71) Applicant: YURA CORPORATION CO., LTD., Seongnam-si (KR)

(72) Inventors: Myeong-jin Kwon, Suwon-si (KR); Chang-hoon Oh, Seoul (KR)

(73) Assignee: YURA CORPORATION CO., LTD.

( * ) Notice: Subject to any disclaimer, the term of this patent is extended or adjusted under 35 U.S.C. 154(b) by 605 days.

(21) Appl. No.: 16/062,315

(22) PCT Filed: Dec. 19, 2016

(86) PCT No.: PCT/KR2016/014891
§ 371 (c)(1),
(2) Date: Jun. 14, 2018

(87) PCT Pub. No.: WO2017/105157
PCT Pub. Date: Jun. 22, 2017

(65) Prior Publication Data
US 2020/0254882 A1 Aug. 13, 2020

(30) Foreign Application Priority Data

Dec. 18, 2015 (KR) .......................... 10-2015-0182249
Mar. 28, 2016 (KR) .......................... 10-2016-0036703

(51) Int. Cl.
*B60L 3/00* (2019.01)
*B60L 50/50* (2019.01)
(Continued)

(52) U.S. Cl.
CPC .............. *B60L 3/0069* (2013.01); *B60L 3/04* (2013.01); *B60L 50/50* (2019.02); *B60L 53/16* (2019.02);
(Continued)

(58) Field of Classification Search
CPC ........ B60L 3/0069; B60L 50/50; B60L 53/60; B60L 53/16; B60L 53/18; B60L 3/04; G01R 31/52; G01R 31/1272; H02J 7/0031
(Continued)

(56) References Cited

U.S. PATENT DOCUMENTS 4,535,409 A * 8/1985 Jindrick .................. H02H 3/06
700/293
5,404,904 A * 4/1995 Glaser ..................... F16K 17/06
137/539

(Continued)

FOREIGN PATENT DOCUMENTS

JP         2009201189 A      9/2009
JP         2010-022163 A     1/2010
(Continued)

OTHER PUBLICATIONS

International Search Report (in English and Korean) and Written Opinion of the International Searching Authority (in Korean) issued in PCT/KR2016/014891; dated Mar. 20, 2017; ISA/KR.
(Continued)

*Primary Examiner* — Suresh Memula
(74) *Attorney, Agent, or Firm* — Harness, Dickey & Pierce, P.L.C.

(57) ABSTRACT

The present invention discloses an auto re-closing device and method for an electric vehicle charging cable control device.
The present invention is directed to an auto re-closing device and method for an electric vehicle charging cable control device, which are capable of stopping charging when a fault occurs and retrying to resume charging when charging is stopped.

14 Claims, 5 Drawing Sheets

(51) Int. Cl.
- *B60L 53/18* (2019.01)
- *B60L 53/60* (2019.01)
- *B60L 53/16* (2019.01)
- *G01R 31/52* (2020.01)
- *B60L 3/04* (2006.01)
- *G01R 31/12* (2020.01)
- *H02J 7/00* (2006.01)

(52) U.S. Cl.
CPC .............. *B60L 53/18* (2019.02); *B60L 53/60* (2019.02); *G01R 31/12* (2013.01); *G01R 31/1272* (2013.01); *G01R 31/52* (2020.01); *H02J 7/0031* (2013.01)

(58) Field of Classification Search
USPC ........................................................ 320/137
See application file for complete search history.

(56) References Cited

U.S. PATENT DOCUMENTS

| | | | |
|---|---|---|---|
| 8,198,855 B2 | 6/2012 | Fukui et al. | |
| 9,187,002 B2 | 11/2015 | Kagawa et al. | |
| 9,557,720 B1* | 1/2017 | Woods | G01R 19/02 |
| 2004/0144756 A1* | 7/2004 | Rhein | H01H 33/6662 |
| | | | 218/120 |
| 2010/0230263 A1* | 9/2010 | Haj-Maharsi | H01H 33/125 |
| | | | 200/48 R |
| 2010/0301809 A1* | 12/2010 | Bhade | H01M 10/441 |
| | | | 320/148 |
| 2013/0338871 A1 | 12/2013 | Kubo et al. | |
| 2014/0211345 A1* | 7/2014 | Thompson | H02H 3/33 |
| | | | 361/42 |
| 2014/0254050 A1 | 9/2014 | Haines et al. | |
| 2015/0236501 A1 | 8/2015 | Lee | |
| 2016/0264012 A1* | 9/2016 | Im | B60L 53/665 |
| 2019/0280476 A1* | 9/2019 | Fan | G01R 31/2836 |

FOREIGN PATENT DOCUMENTS

| | | |
|---|---|---|
| JP | 2011-160589 A | 8/2011 |
| JP | 2014057471 A | 3/2014 |
| JP | 2014-073001 A | 4/2014 |
| KR | 10-2014-0114177 A | 9/2014 |
| WO | 2010113936 A1 | 10/2010 |
| WO | WO-2015-148678 A1 | 10/2015 |

OTHER PUBLICATIONS

Extended European Search Report for Application No. EP 16876099.9 dated Nov. 12, 2019 (9 pages).

Chinese Office Action dated Apr. 27, 2021 for Application No. 201680074616.0 (with English translation) (23 pages).

* cited by examiner

AUTOMATIC RECLOSING DEVICE AND METHOD FOR ELECTRICAL VEHICLE CHARGING CABLE CONTROL DEVICE

CROSS REFERENCE TO RELATED APPLICATIONS

This application is a U.S. National Phase Application under 35 U.S.C. 371 of International Application No. PCT/KR2016/014891 filed on Dec. 19, 2016 and published in Korean as WO 2017/105157 A1 on Jun. 22, 2017. This application claims the benefit of priority from Korean Patent Application No. 10-2015-0182249 filed Dec. 18, 2015 and 10-2016-0036703, filed on Mar. 28, 2016. The entire disclosures of all of the above applications are incorporated herein by reference.

TECHNICAL FIELD

The present invention relates to an auto re-closing device and method for an electric vehicle charging cable control device, and more particularly, to an auto re-closing device and method for a control device controlling an electric vehicle charging cable.

BACKGROUND ART

The following description is provided to merely give background information related to the present invention and should not be construed as forming the prior art.

A re-closing device is a fault-interrupting device which senses a fault in a current, a voltage, a frequency, etc. and removes the fault from a distribution panel. A re-closing control device performs a re-closing operation. The re-closing device serves to protect a power distribution system.

Figure 1:
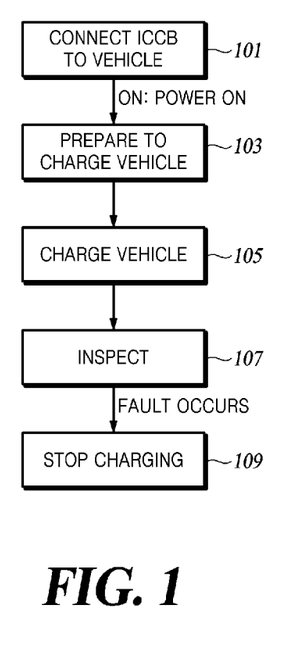
FIG. 1 is a flowchart of a method of operating an electric vehicle charging cable control device according to the related art.

FIG. 1 is a flowchart of a method of operating an electric vehicle charging cable control device according to the related art.

First, the electric vehicle charging cable control device is connected to an electric vehicle via a charging cable and is then powered on (101). Here, the electric vehicle charging cable control device is located on the charging cable which supplies power to the electric vehicle. When a battery of the electric vehicle is charged, the electric vehicle charging cable control device supplies power or cuts off the supply of power according to circumstances. Furthermore, the electric vehicle charging cable control device transmits information indicating whether the battery is currently being charged, information indicating that the supply of power is cut off when an error occurs during charging of the battery, and information regarding a chargeable capacity of the battery, etc. to the electric vehicle. The electric vehicle charging cable control device may be embodied as an in-cable control box (ICCB) or an in-cable control and protection device (IC-CPD).

When the electric vehicle charging cable control device is on, preparation to charge the battery is completed (103). Next, charging of the battery of the electric vehicle connected to a cable of the electric vehicle charging cable control device is started (105). When charging of the battery is started, the electric vehicle charging cable control device inspects whether there is an operational fault which may occur during charging of the electric vehicle (107). The inspecting of whether there is an operational fault, performed by the electric vehicle charging cable control device, may include inspecting whether leakage current is generated in the charging cable or the electric vehicle charging cable control device or inspecting whether internal temperature of the electric vehicle charging cable control device is extremely low or high. When the electric vehicle charging cable control device determines that a fault occurs, charging of the electric vehicle is stopped (109).

Figure 2:
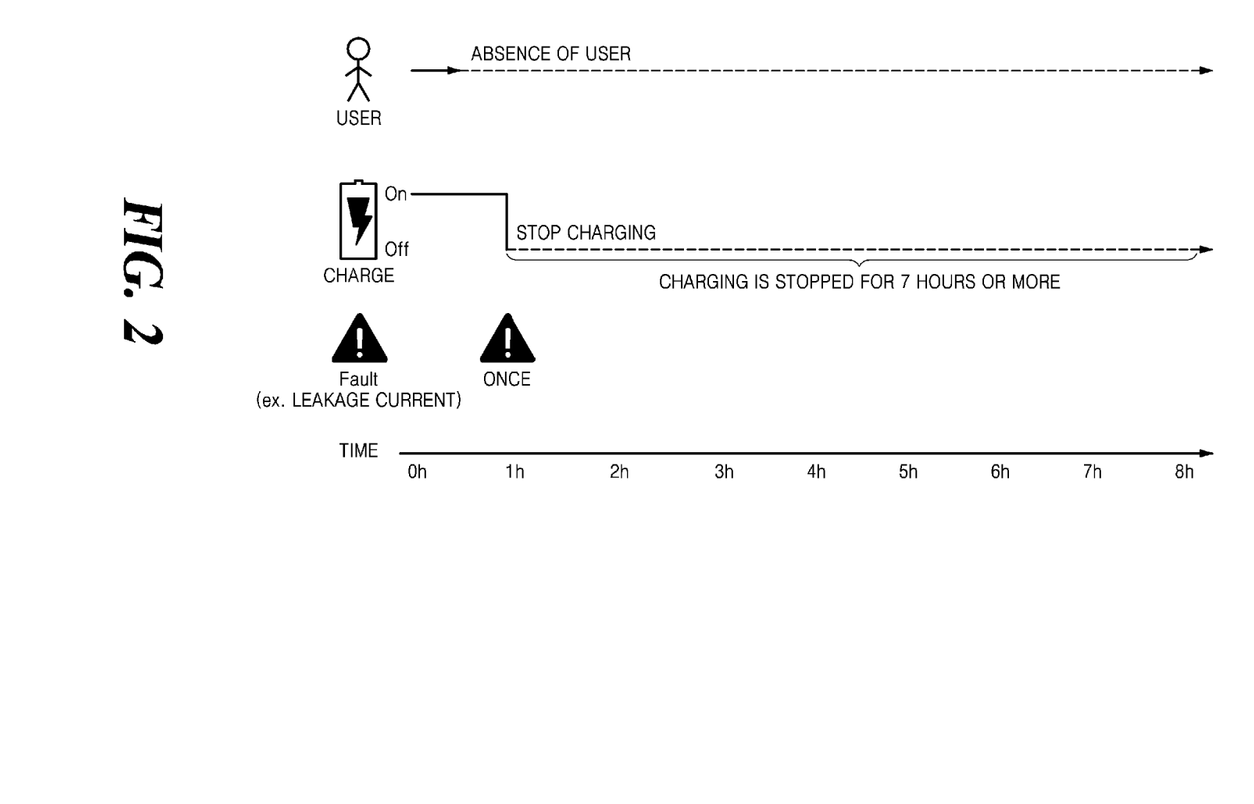
FIG. 2 is a waveform diagram illustrating a method of operating an electric vehicle charging cable control device according to the related art.

FIG. 2 is a waveform diagram illustrating a method of operating an electric vehicle charging cable control device according to the related art. It is assumed in FIG. 2 that a user is absent. Referring to FIG. 2, the electric vehicle charging cable control device inspects whether a fault such as leakage current, low temperature, and high temperature occurs. The electric vehicle charging cable control device according to the related art stops charging an electric vehicle as soon as a fault occurs. Once charging of the electric vehicle is stopped, the electric vehicle charging cable control device according to the related art does not proceed with charging of the electric vehicle unless a user manually tries to resume charging of the electric vehicle.

When a fault, such as an abnormal temperature or generation of leakage current, occurs, the electric vehicle charging cable control device according to the related art stops charging of the electric vehicle and does not proceed with charging of the electric vehicle unless a user tries to resume charging of the electric vehicle. Accordingly, when the electric vehicle charging cable control device according to the related art is used, the user should frequently check whether a fault occurs and manually retry to resume the charging of the electric vehicle. If a fault occurs during charging of the electric vehicle when the user is away from a charging place for a long time, a battery of the electric vehicle may not be charged for the long time, during which charging of the electric vehicle is tried. Thus, unexpected inconvenience may be caused to the user who expects the electric vehicle to be available as soon as charging of the electric vehicle is completed. Furthermore, after charging of the electric vehicle is stopped due to a fault, the user's attempt to resume charging of the electric vehicle in a state in which the fault is not fixed may damage the electric vehicle or cause a dangerous situation (e.g., an electrical shock or fire) to occur due to failure during charging of the electric vehicle.

DISCLOSURE

Technical Problem

The present invention is directed to an auto re-closing device and method for an electric vehicle charging cable control device, which are capable of stopping charging when a fault occurs and retrying to resume charging when charging is stopped.

The present invention is also directed to an auto re-closing device and method for an electric vehicle charging cable control device, which are capable of stopping charging when a fault occurs a predetermined number of times for a predetermined time and retrying to resume charging by determining whether the fault is fixed or not.

Technical Solution

In accordance with some embodiments of the present disclosure, an auto re-closing device for an electric vehicle charging cable control device which is installed on a charging cable for supplying power to an electric vehicle from a power supply and controls charging of the electric vehicle, the auto re-closing device comprises: a fault sensor configured to sense a fault occurring during charging of the electric vehicle; a microcontroller unit (MCU) configured to control trying to charge the electric vehicle to be stopped when the fault occurs a predetermined number of times within a predetermined time, determine whether the fault is fixed after trying to charge the electric vehicle is stopped, and control charging of the electric vehicle to be retried when the fault is fixed; and a re-closing unit configured to disconnect or re-close connection between the power supply and the electric vehicle via the charging cable, under control of the MCU.

In accordance with some embodiments of the present disclosure, a re-closing method for an electric vehicle charging cable control device which is installed on a cable for supplying power to an electric vehicle from a power supply and which performs an auto re-closing function of controlling charging of the electric vehicle, the auto re-closing method comprises: sensing a fault occurring during charging of the electric vehicle; a first control operation of controlling trying to charge the electric vehicle to be stopped when the fault occurs a predetermined number of times within a predetermined time; determining whether the fault is fixed after trying to charge the electric vehicle is stopped; and a second control operation of controlling the stopped charging of the electric vehicle to be retried when the fault is fixed.

In accordance with some embodiments of the present disclosure, a computer program causes a computer, which is installed on a cable for supplying power to an electric vehicle from a power supply and performing an auto re-closing function of controlling charging of the electric vehicle, to perform: sensing a fault occurring during charging of the electric vehicle; a first control operation of controlling trying to charge the electric vehicle to be stopped when the fault occurs a predetermined number of times within a predetermined time; determining whether the fault is fixed after trying to charge the electric vehicle is stopped; and a second control operation of controlling the stopped charging of the electric vehicle to be retried when the fault is fixed.

Advantageous Effects

As apparent from the foregoing, an auto re-closing device for an electric vehicle charging cable control device according to an embodiment of the present invention is capable of stopping charging when a fault occurs a predetermined number of times for a predetermined time and retrying to resume charging by determining whether the fault is fixed or not. Accordingly, safety can be secured and an electric vehicle may be prevented from being damaged due to a fault.

In the auto re-closing device for the electric vehicle charging cable control device according to an embodiment of the present invention, charging is automatically retried when a fault is fixed and thus a user need not move to a charging place to retry to resume charging. Furthermore, the user need not continuously check a charged state (whether charging is stopped), thereby removing user inconvenience.

In addition, in the auto re-closing device for the electric vehicle charging cable control device according to an embodiment of the present invention, even if charging is stopped due to a fault occurring during charging of the electric vehicle, charging is automatically retried when the fault is fixed. Accordingly, a user is able to use the electric vehicle at any time, thereby increasing user convenience.

MODE OF DISCLOSURE

Hereinafter, operations and effects of the present invention will be described in detail with reference to the accompanying drawings.

Figure 3:
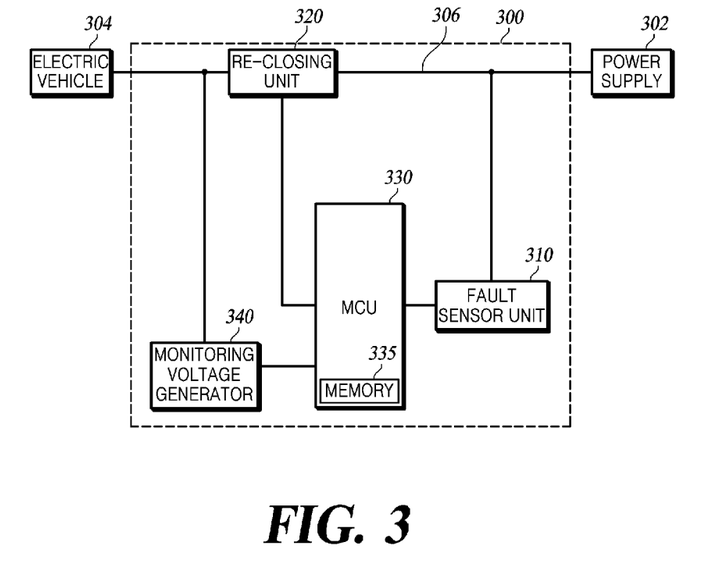
FIG. 3 is a block diagram of an auto re-closing device for an electric vehicle charging cable control device, according to an embodiment of the present invention.
Figure 4:
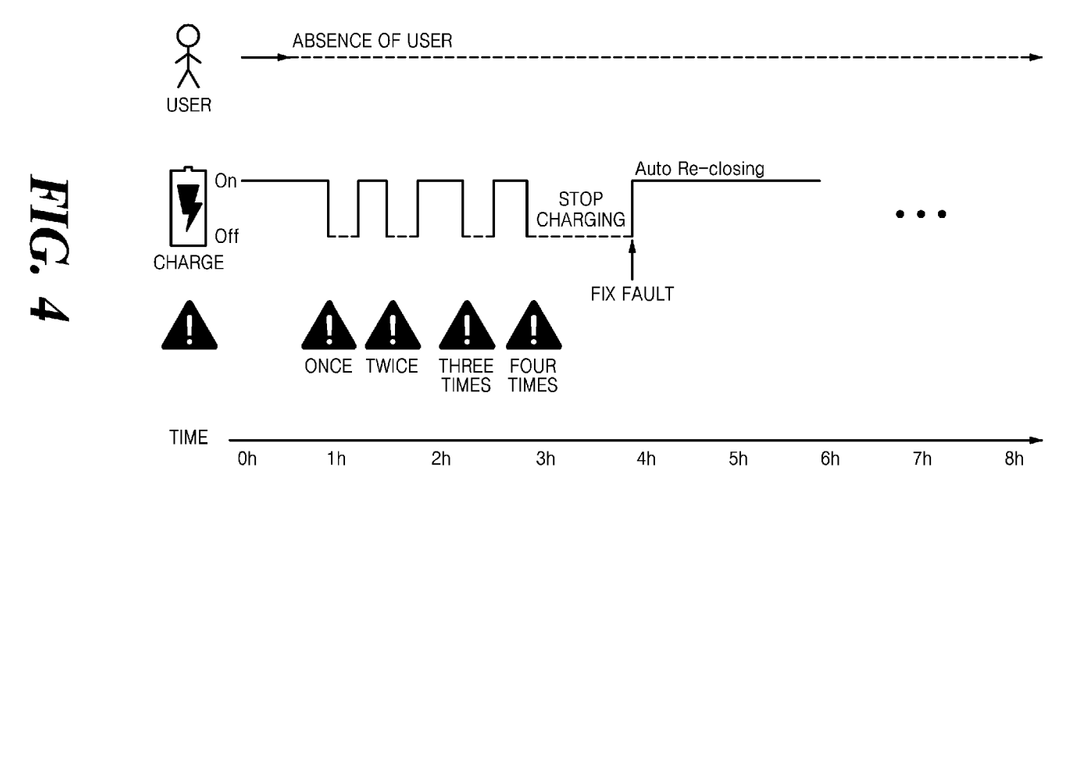
FIG. 4 is a waveform diagram illustrating a method of operating an electric vehicle charging cable control device, according to an embodiment of the present invention.

FIG. 3 is a block diagram of an auto re-closing device for an electric vehicle charging cable control device, according to an embodiment of the present invention. FIG. 4 is a waveform diagram illustrating a method of operating an electric vehicle charging cable control device, according to an embodiment of the present invention. An auto re-closing device 300 for an electric vehicle charging cable control device is installed on a charging cable 306 for supplying power to an electric vehicle 304 from a power supply 302, and controls charging the electric vehicle 304. Here, the electric vehicle 304 may be any device having a battery therein.

The auto re-closing device 300 for an electric vehicle charging cable control device includes a fault sensor unit 310, a re-closing unit 320, a microcontroller unit (MCU) 330, and a monitoring voltage generator 340.

The fault sensor unit 310 includes sensors and senses a cause of a fault. When the electric vehicle 304 is charged using the charging cable 306, examples of a cause of a fault may include leakage current, overload current, or an arc which may be generated in the charging cable 306, and a change in an internal temperature or humidity of the electric vehicle charging cable control device. That is, the fault sensor unit 310 may include various types of sensors and sense a current or an arc generated in the charging cable 306 or a change in an internal temperature or humidity of the electric vehicle charging cable control device. The fault sensor unit 310 senses a value of such a cause of a fault and transmits the sensed value to the MCU 330.

The re-closing unit 320 disconnects or recloses connection between the power supply 302 and the electric vehicle 304 via the charging cable 306, under control of the MCU 330. When the MCU 330 tries to stop charging of the electric vehicle 304, the re-closing unit 320 disconnects connection between the power supply 302 and the electric vehicle 304 via the charging cable 306 to stop charging. In contrast, when the MCU 330 controls charging to be retried, the re-closing unit 320 recloses connection between the power supply 302 and the electric vehicle 304 which are disconnected from each other.

The MCU 330 controls the re-closing unit 320 to retry charging when charging is stopped due to a fault, and stops the retrying of the charging when a fault occurs more than a predetermined number of times for a predetermined time. Upon determining that a fault occurs and charging is stopped as described above, the MCU 330 controls the re-closing unit 320 to resume charging by transmitting a charging retry control signal to the re-closing unit 320. The MCU 330 may resume charging without checking a cause of the fault according to a method of automatically resuming charging after a certain time period (according to a time-fixed method or a time-dependent method). Alternatively, for safety, charging may be retried when the cause of the fault (leakage current, overload current, an arc, or an abnormal temperature or humidity) sensed by the fault sensor unit 310 is fixed. In this case, the MCU 330 may control charging not to be automatically resumed when charging is stopped due to short-circuit current or is stopped by an operator. However, if a fault occurs a predetermined number of times for the predetermined time, the MCU 330 tries to stop charging of the electric vehicle 304 when the fault occurs again. It is assumed that, for example, the predetermined time is three hours and the predetermined number of times is 3. As illustrated in FIG. 4, the MCU 330 controls charging to be retried to resume charging when charging is stopped due to a fault occurring three times after about one hour (1 h), after one and a half hours, and after two and a half hours from the start of the charging. However, when a fourth fault occurs after about three hours from the start of charging, the MCU 330 controls charging to be stopped without retrying charging. Since the fault occurred three times within three hours from the start of charging of the electric vehicle 304, when a fault occurs again, the MCU 330 stops charging regardless of when the fault occurs and a number of times the fault occurs. That the fault occurs more than the predetermined number of times for the predetermined time may be understood to mean that the charging cable 306 or the electric vehicle charging cable control device has a fault and thus needs to be repaired. Alternatively, the predetermined number of times may be set to 1 so that the MCU 330 may try to stop charging of the electric vehicle 304 even when a fault occurs only once. For example, when a value sensed by the fault sensor unit 310 is far greater than a predetermined threshold value or when a try to charge the electric vehicle 304 may cause danger to occur due to a fault, the MCU 330 may stop trying to charge the electric vehicle 304 even when a fault occurs once, if necessary. The waveform diagram of FIG. 4 illustrates a case in which the predetermined number of times is 3, but embodiments are not limited thereto and time when charging is stopped may be changed by differently setting the predetermined time or the predetermined number of times.

The MCU 330 controls the re-closing unit 320 to retry charging when charging is stopped due to a fault, and stops retrying charging when a fault occurs more than the predetermined number of times for the predetermined time. The MCU 330 controls the re-closing unit 320 to resume charging by transmitting a charging retry control signal to the re-closing unit 320 upon determining that a fault occurs and thus charging is stopped as described above. The MCU 330 may resume charging without checking a cause of the fault according to the method of automatically resuming charging after a certain time period (according to the time-fixed method or the time-dependent method). Alternatively, for safety, charging may be retried when the cause of the fault (leakage current, overload current, an arc, or abnormal temperature or humidity) sensed by the fault sensor unit 310 is fixed. In this case, the MCU 330 may control charging not to be automatically resumed when charging is stopped due to short-circuit current or is stopped by an operator. However, the MCU 330 tries to stop charging of the electric vehicle 304 when a fault occurs more than the predetermined number of times for the predetermined time. For example, the MCU 330 stops retrying to charge the electric vehicle 304 when the predetermined time is set to thirty minutes, the predetermined number of times is set to 3, a fault occurs more than three times for thirty minutes and thus charging is stopped and retried. Alternatively, the predetermined number of times may be set to 1 and the MCU 330 may try to stop charging of the electric vehicle 304 when a fault occurs only once. For example, the MCU 330 may stop trying to charge the electric vehicle 304 even when a fault occurs only once if necessary, e.g., when a value sensed by the fault sensor unit 310 is far greater than a predetermined threshold value or when danger may be incurred due to trying to charge the electric vehicle 304 after occurrence of the fault. That the fault occurs more than the predetermined number of times for the predetermined time may be understood to mean that the charging cable 306 or the electric vehicle charging cable control device has a fault and thus needs to be repaired. Referring to the waveform diagram of FIG. 4, the MCU 330 retried charging to resume charging when charging is stopped due to a fault occurring after about one hour (1 h), about one and a half hours, and about two and a half hours from the start of charging. However, the MCU 330 stops charging when charging is stopped again due to a fault occurring after about three hours from the start of charging of the electric vehicle 304. The MCU 330 determines that the fault occur more than the predetermined number of times for the predetermined time and thus stops charging. Although the waveform diagram of FIG. 4 illustrates a case in which the predetermined number of times is set to 3, embodiments are not limited thereto and a point of time when charging is stopped may be changed by differently setting the predetermined number of times.

If trying to charge the electric vehicle 304 is stopped when a fault occurs more than the predetermined number of times for the predetermined time, the MCU 330 determines whether the fault is fixed and retries charging when the fault is fixed. The MCU 330 determines whether the fault is fixed after trying to charge the electric vehicle 304 is stopped. In order to determine whether the fault is fixed, the MCU 330 may determine whether a sensed value is less than a predetermined reference value. Here, the predetermined reference value is less than the predetermined threshold value used for the MCU 330 to determine whether a fault occurs. That is, the MCU 330 determines whether the fault is fixed by determining whether the sensed value is less than a value (a reference value) which is less than the predetermined threshold value used to determine whether a fault occurs. When the sensed value is less than the predetermined reference value, the MCU 330 determines that the fault is fixed and thus controls the re-closing unit 320 to retry charging. In contrast, when the sensed value is not less than the predetermined reference value, the MCU 330 determines that the fault is not fixed and controls the re-closing unit 320 to continue stopping charging. The determining of whether the fault is fixed, performed by the MCU 330, may be performed in real time or at predetermined time intervals. Upon determining that the fault is fixed after the try to charge the electric vehicle 304 is stopped, the MCU 330 controls the re-closing unit 320 to resume charging by transmitting a charging retry control signal to the re-closing unit 320. In this case, the MCU 330 may set a number of times a fault occurred, which was previously counted, while controlling the re-closing unit 320 to retry charging by transmitting the charging retry control signal to the re-closing unit 320. Since the MCU 330 resets the number of times the fault occurred, trying to charge the electric vehicle 304 is prevented from being stopped as soon as a fault occurs at a later time. As described above, in order to retry charging after charging is stopped, the MCU 330 determines whether a fault is fixed and controls charging to be retried only upon determining that the fault is fixed. Thus, charging may be retried in a safe state. Furthermore, the MCU 330 controls the re-closing unit 320 to retry charging without user manipulation when the fault is fixed, thereby increasing user convenience. Referring to the waveform diagram of FIG. 4, the MCU 330 determines whether the fault is fixed after charging is stopped, under control of the MCU 330. Upon determining that the fault is fixed, the MCU 330 controls charging to be retried to resume charging.

When the fault is overload current or leakage current, it may be difficult for the MCU 330 to determine whether the fault is fixed. When a fault has occurred more than the predetermined number of times for the predetermined time and thus trying to charge the electric vehicle 304 was stopped, the overload current or the leakage current is not generated and is thus not sensed by the fault sensor unit 310. Thus, when trying to charge the electric vehicle 304 is stopped due to a fault which is an overload current or a leakage current, the overload current or the leakage current should be generated to determine whether the fault is fixed. In this case, a voltage to be used to generate the overload current or the leakage current is a monitoring voltage. The monitoring voltage is a voltage intentionally generated by the fault sensor unit 310 to determine whether a fault caused by overload current or leakage current is fixed, and is equal to or less than a safety extra low voltage (SELV) which is an alternating current (AC) voltage of 25 V or less or a direct current (DC) voltage of 60 V. When charging is stopped due to overload current or leakage current, the MCU 330 transmits a monitoring-voltage control signal for generating the monitoring voltage to the monitoring voltage generator 340. The monitoring voltage generator 340 receives the monitoring-voltage control signal from the MCU 330 and applies a monitoring voltage to the charging cable 306. Accordingly, the overload current or the leakage current flows again through the charging cable 306 due to the monitoring voltage and thus the fault sensor unit 310 may sense the overload current or the leakage current. The MCU 330 determines whether the fault is fixed by determining whether a value of the overload current or the leakage current sensed by the fault sensor unit 310 is less than the predetermined reference value. When the sensed value of the overload current or the leakage current is less than the predetermined reference value, the MCU 330 determines that the fault is fixed and controls charging to be retried. When the sensed value of the overload current or the leakage current is not less than the predetermined reference value, the MCU 330 determines that the fault is not fixed and controls the re-closing unit 320 to continuously stop charging. The MCU 330 may generate the monitoring-voltage control signal for generating the monitoring voltage at predetermined time intervals for a predetermined time. For example, when the predetermined time is set to one hour and the predetermined interval times are set to 20 seconds, the MCU 330 may generate the monitoring-voltage control signal every 20 seconds for one hour. The MCU 330 may generate the monitoring-voltage control signal for the predetermined time as described above. When the fault is not fixed and thus charging is not retried within the predetermined time, the MCU 330 may control the monitoring-voltage control signal not to be generated or may generate the monitoring-voltage control signal for another predetermined time to determine whether the fault is fixed after the predetermined time.

Upon receiving the monitoring-voltage control signal from the MCU 330, the monitoring voltage generator 340 generates a monitoring voltage and applies it to the charging cable 306. Since the monitoring voltage generator 340 applies the monitoring voltage to the charging cable 306, the fault sensor unit 310 may sense an overload current or a leakage current again.

The electric vehicle charging cable control device 300 may further include a communication unit (not shown). The communication unit may transmit a part or all of information regarding a number of times a fault occurred, time when the fault occurred, and a cause of the fault, the information being stored in a memory 335 of the MCU 330, to a user terminal, a server of a maintenance shop, etc. As described above, a user may be able to easily identify the occurred fault since the communication unit transmits the part or all of the information regarding the number of times the fault occurred, the time when the fault occurred, and the cause of the fault, the information being stored in the memory 335 of the MCU 330, to the user terminal, a server, etc.

The components of the electric vehicle charging cable control device illustrated in FIG. 3 are connected in a communication path connecting software or hardware modules installed in the device and are thus operated in relation to each other. The components communicate with one another via one or more communication buses or signal lines.

Figure 5:
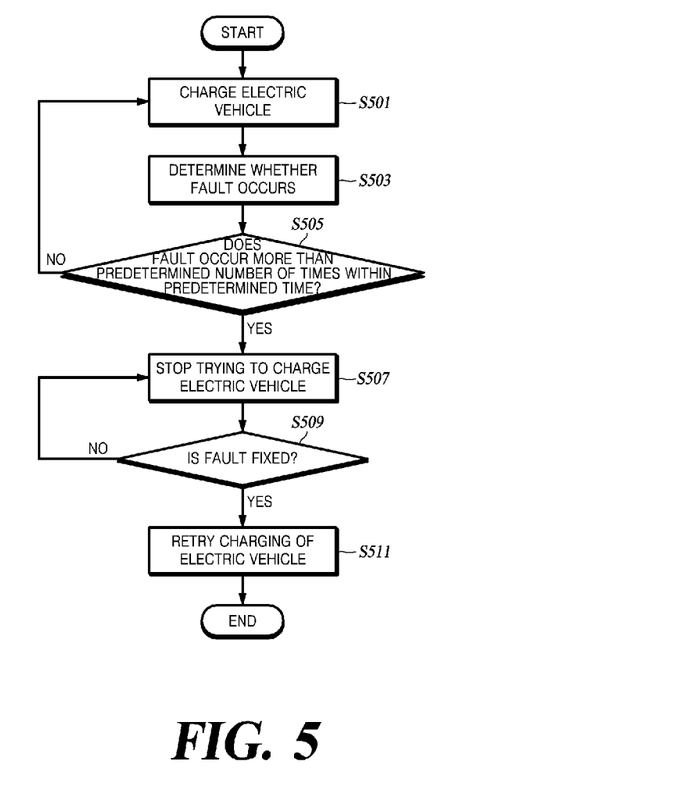
FIG. 5 is a flowchart of a method of operating an electric vehicle charging cable control device, according to an embodiment of the present invention.

FIG. 5 is a flowchart of a method of operating an electric vehicle charging cable control device, according to an embodiment of the present invention.

Referring to FIG. 5, charging a battery of the electric vehicle 304 connected to the charging cable 306 is started (S501). Charging is started when preparation to charge the battery is completed by connecting the charging cable 306 to the electric vehicle 304 and the power supply 302.

When charging is started, the electric vehicle charging cable control device determines whether a fault occurs during charging of the battery of the electric vehicle 304 (S503). The MCU 330 receives a sensed value regarding a cause of the fault from the fault sensor unit 310, and determines whether the sensed value regarding the cause of the fault is greater than a predetermined threshold value to determine whether a fault occurs. In this case, when a fault occurs, the MCU 330 stores information regarding a number of times the fault occurs and time when the fault occurs in the memory 335.

The MCU 330 determines whether the fault occurs more than a predetermined number of times within a predetermined time (S505). The MCU 330 checks the number of times the fault occurs and the time when the fault occurs on the basis of the information stored in the MCU 330, and determines whether the fault occurs more than the predetermined number of times within the predetermined time.

When the fault occurs more than the predetermined number of times within the predetermined time, the electric vehicle charging cable control device stops trying to charge the electric vehicle 304 (S507).

After trying to charge the electric vehicle 304 is stopped, it is determined whether the fault is fixed (S509). The MCU 330 determines whether the fault is fixed, after trying to charge the electric vehicle 304 is stopped since the fault occurs more than the predetermined number of times within the predetermined time. When whether the fault is fixed is determined, the MCU 330 determines that the fault is fixed when the sensed value regarding the cause of the fault is less than the predetermined reference value. In this case, when the fault is an overload current or a leakage current, the MCU 330 generates a monitoring-voltage control signal and transmits the same to the monitoring voltage generator 340. The monitoring voltage generator 340 generates a monitoring voltage and applies the same to the charging cable 306.

As the monitoring voltage is applied to the charging cable 306, the fault sensor unit 310 may sense the overload current or the leakage current and the MCU 330 may determine whether the fault is fixed on the basis of the sensed value. Charging may be retried at a later time in a safe situation by determining whether the fault is fixed.

Upon determining that the fault is fixed, charging of the electric vehicle 304 is retried (S511). Upon determining, through the above process, that the fault is fixed, charging may be retried in a safe situation and thus the MCU 330 retries charging of the electric vehicle 304 through the re-closing unit 320. Since charging is retried in a situation in which the fault is fixed, the MCU 330 performs charging in the safe situation without additional user manipulation. The MCU 330 retries charging and initializes the number of times the fault occurred, which is stored therein.

Steps are described to be sequentially performed in FIG. 5 as a mere example for describing the technical idea of some embodiments, although one of ordinary skill in the pertinent art would appreciate that various modifications, additions and substitutions are possible by performing the sequences shown in FIG. 5 in a different order or at least one of steps in parallel without departing from the idea and scope of the embodiments, and hence the example shown in FIG. 5 is not limited to the chronological order.

The steps shown in FIG. 5 can be implemented as a computer program, and can be recorded on a non-transitory computer-readable medium. The computer-readable recording medium includes any type of recording device on which data that can be read by a computer system are recordable. Examples of the computer-readable recording medium include a magnetic storage medium (e.g., a floppy disk, a hard disk, a ROM, USB memory, etc.), an optically readable medium (e.g., a CD-ROM, DVD, Blue-ray, etc.) and carrier waves (e.g., transmission through the Internet). Further, an example computer-readable recording medium has computer-readable codes that can be stored and executed in a distributed mode in computer systems connected via a network. Although exemplary embodiments of the present disclosure have been described for illustrative purposes, those skilled in the art will appreciate that various modifications, additions and substitutions are possible, without departing from the idea and scope of the claimed invention. Exemplary embodiments of the present disclosure have been described for the sake of brevity and clarity. Accordingly, one of ordinary skill would understand the scope of the disclosure is not limited by the explicitly described above embodiments but is inclusive of the claims and equivalents thereof.

The invention claimed is:

1. An auto re-closing device for an electric vehicle charging cable control device which is installed on a charging cable for supplying power to an electric vehicle from a power supply and controls charging of the electric vehicle, the auto re-closing device comprising:
a fault sensor configured to sense a fault occurring during charging of the electric vehicle;
a microcontroller unit (MCU) configured to control trying to charge the electric vehicle to be stopped when the fault occurs more than a predetermined number of times within a predetermined time, determine whether the fault is fixed after trying to charge the electric vehicle is stopped, and control charging of the electric vehicle to be retried when the fault is fixed; and
a re-closing unit configured to disconnect or re-close connection between the power supply and the electric vehicle via the charging cable, under control of the MCU;
wherein when a value of the fault sensed by the fault sensor is greater than a predeterminded threshold value, the MCU determines that the fault occurs and counts a number of times the fault occurs; and
wherein when a value sensed by the fault sensor is less than a predetermined reference value which is less than the predetermined threshold value, the MCU determines that the fault is fixed.

2. The auto re-closing device of claim 1, wherein the fault sensor senses at least one among a leakage current, an overload current, an arc, and a temperature and humidity of the electric vehicle charging cable control device which are generated during charging of the electric vehicle.

3. The auto re-closing device of claim 1, wherein the MCU counts the number of times the fault occurs, and stores information regarding a cause of the fault or time when the fault occurs, together with the counted number of times.

4. The auto re-closing device of claim 1, wherein the MCU determines whether the fault is fixed at predetermined time intervals.

5. The auto re-closing device of claim 1, wherein, when the fault is overload current or leakage current, the MCU generates a monitoring-voltage control signal to determine whether the fault is fixed.

6. The auto re-closing device of claim 5, further comprising a monitoring voltage generator configured to generate a monitoring voltage by receiving the monitoring-voltage control signal and apply the monitoring voltage to the charging cable.

7. The auto re-closing device of claim 6, wherein the MCU determines whether the fault is fixed by determining whether a value of an overload current or a leakage current, which is generated using the monitoring voltage and is sensed by the fault sensor, is less than a predetermined reference value.

8. The auto re-closing device of claim 5, wherein the MCU generates the monitoring-voltage control signal at predetermined time intervals for the predetermined time.

9. The auto re-closing device of claim 1, wherein, when the fault is fixed and thus charging of the electric vehicle is retried, the MCU resets the counted number of times the fault occurs.

10. A re-closing method for an electric vehicle charging cable control device which is installed on a cable for supplying power to an electric vehicle from a power supply and which performs an auto re-closing function of controlling charging of the electric vehicle, the auto re-closing method comprising:
sensing a fault occurring during charging of the electric vehicle;
a first control operation of controlling trying to charge the electric vehicle to be stopped when the fault occurs more than a predetermined number of times within a predetermined time;
determining whether the fault is fixed after trying to charge the electric vehicle is stopped; and
a second control operation of controlling the stopped charging of the electric vehicle to be retried when the fault is fixed,
wherein the sensing the fault comprises determining that the fault occurs when a value of the fault sensed by a fault sensor is greater than a predetermined threshold value, and counting a number of times the fault occurs; and wherein the determining of whether the fault is fixed comprises determining that the fault is fixed when a value sensed by the fault sensor is less than a predetermined reference value which is less than the predetermined threshold value.

11. The re-closing method of claim 10, wherein the fault comprises at least one among leakage current, overload current, an arc, and an abnormal temperature and humidity of the electric vehicle charging cable control device which are generated during charging of the electric vehicle.

12. The re-closing method of claim 11, wherein the determining of whether the fault is fixed comprises generating a monitoring voltage to determine whether the fault is fixed when the fault is the overload current or the leakage current.

13. The re-closing method of claim 12, wherein the determining of whether the fault is fixed comprises determining whether the fault is fixed by determining whether a value of the overload current or the leakage current sensed during the sensing of the fault is less than a predetermined reference value by using the monitoring voltage.

14. A computer program embodied in a computer readable medium causing a computer, which is installed on a cable for supplying power to an electric vehicle from a power supply and performing an auto re-closing function of controlling charging of the electric vehicle, to perform:

sensing a fault occurring during charging of the electric vehicle;

a first control operation of controlling trying to charge the electric vehicle to be stopped when the fault occurs more than a predetermined number of times within a predetermined time;

determining whether the fault is fixed after trying to charge the electric vehicle is stopped; and a second control operation of controlling the stopped charging of the electric vehicle to be retried when the fault is fixed, wherein the sensing the fault comprises determining that the fault occurs when a value of the fault sensed by a fault sensor is greater than a predetermined threshold value, and counting a number of times the fault occurs, and wherein the determining of whether the fault is fixed comprises determining that the fault is fixed when a value sensed by the fault sensor is less than a predetermined reference value which is less than the predetermined threshold value.

* * * * *